US008368399B2

(12) United States Patent
Lee

(10) Patent No.: US 8,368,399 B2
(45) Date of Patent: Feb. 5, 2013

(54) MODE-SCANNING EXCITATION MAGNETIC RESONANCE IMAGING METHOD AND SYSTEM

(75) Inventor: Ray F. Lee, New York, NY (US)

(73) Assignee: New York University, New York, NY (US)

(*) Notice: Subject to any disclaimer, the term of this patent is extended or adjusted under 35 U.S.C. 154(b) by 2001 days.

(21) Appl. No.: 11/429,557

(22) Filed: May 5, 2006

(65) Prior Publication Data

US 2006/0253019 A1    Nov. 9, 2006

Related U.S. Application Data

(60) Provisional application No. 60/678,574, filed on May 5, 2005.

(51) Int. Cl.
G01V 3/00    (2006.01)

(52) U.S. Cl. .................. 324/314; 324/307; 324/309

(58) Field of Classification Search .......... 324/300–307, 324/308–322; 382/128–131; 600/407–435
See application file for complete search history.

(56) References Cited

U.S. PATENT DOCUMENTS

| | | | | |
|---|---|---|---|---|
| 3,348,093 | A * | 10/1967 | Holly | 315/3 |
| 3,371,196 | A * | 2/1968 | Lerwill et al. | 708/817 |
| 4,752,735 | A * | 6/1988 | Onodera et al. | 324/309 |
| 4,761,545 | A * | 8/1988 | Marshall et al. | 250/291 |
| 5,218,299 | A * | 6/1993 | Dunkel | 324/307 |
| 6,476,606 | B2 * | 11/2002 | Lee | 324/309 |
| 6,564,082 | B2 * | 5/2003 | Zhu | 600/410 |
| 6,593,740 | B1 * | 7/2003 | Van Den Brink et al. | 324/307 |
| 6,915,152 | B2 * | 7/2005 | Zhu | 600/422 |
| 6,989,673 | B2 * | 1/2006 | Zhu | 324/318 |
| 7,053,618 | B2 * | 5/2006 | Zhu | 324/318 |
| 7,075,301 | B2 * | 7/2006 | Zhu | 324/318 |
| 7,075,302 | B2 * | 7/2006 | Zhu | 324/318 |
| 7,501,825 | B2 | 3/2009 | Lee | |
| 7,511,492 | B2 * | 3/2009 | Sodickson et al. | 324/309 |
| 7,795,870 | B2 * | 9/2010 | Sodickson et al. | 324/309 |
| 7,800,368 | B2 * | 9/2010 | Vaughan et al. | 324/318 |
| 8,159,223 | B2 * | 4/2012 | Luekeke et al. | 324/318 |
| 2003/0004408 | A1 * | 1/2003 | Zhu | 600/410 |
| 2003/0004410 | A1 * | 1/2003 | Zhu | 600/422 |
| 2005/0110487 | A1 * | 5/2005 | Zhu | 324/309 |
| 2005/0110488 | A1 * | 5/2005 | Zhu | 324/309 |
| 2005/0134267 | A1 * | 6/2005 | Zhu | 324/309 |
| 2005/0134268 | A1 * | 6/2005 | Zhu | 324/309 |
| 2005/0140369 | A1 | 6/2005 | Feiweier et al. | |
| 2006/0253019 | A1 * | 11/2006 | Lee | 600/410 |
| 2007/0063801 | A1 * | 3/2007 | Laskaris | 335/301 |
| 2007/0241753 | A1 * | 10/2007 | Sodickson et al. | 324/307 |
| 2008/0129298 | A1 * | 6/2008 | Vaughan et al. | 324/322 |
| 2008/0279433 | A1 * | 11/2008 | Brau et al. | 382/131 |
| 2009/0108844 | A1 * | 4/2009 | Sodickson et al. | 324/309 |
| 2009/0118611 | A1 * | 5/2009 | He | 324/322 |
| 2010/0039111 | A1 * | 2/2010 | Luekeke et al. | 324/318 |
| 2011/0044524 | A1 * | 2/2011 | Wang et al. | 382/131 |

OTHER PUBLICATIONS

Vaughn, JT, et al. *Magnetic Resonance Med.*, 2001, 46:24. Ray F. Lee et al., (2007) "A transmit/receive Volume Strip Array and Its mode Mixing Theory in MRI" ScienceDirect, Magnetic Resonance Imaging vol. 25, pp. 1312-1332.
Ray F. Lee et al., (2006) "Implementation of Mode-Scanning Excitation Method with a 16-ch Transmit/Receive Volume Strip Array at 7T".
Ray F Lee., (2005) "Mode-Scanning Excitation (MSE) Method for Locally Homogeneous Transmit Profile at 7T" Proc. Intl. Sco. Mag. Reson. Med. vol. 13.

* cited by examiner

*Primary Examiner* — Melissa Koval
*Assistant Examiner* — Tiffany Fetzner
(74) *Attorney, Agent, or Firm* — Dorsey & Whitney LLP

(57) ABSTRACT

A method, apparatus and computer-readable medium are provided for generating a specified transmit magnetic field profile in the presence of an object. In particular, further transmitted magnetic field profiles are obtained in the presence of the object, where the further profiles correspond to modes associated with an array of conductive elements. In addition, weighting factors associated with the modes are calculated using the specific profile and further profiles. Further, the specified profile can be generated by applying signals to ports associated with the conductive elements, where the signals are based on the weighting factors.

33 Claims, 4 Drawing Sheets

MODE-SCANNING EXCITATION MAGNETIC RESONANCE IMAGING METHOD AND SYSTEM

CROSS-REFERENCE TO RELATED APPLICATION(S)

This application claims priority from U.S. patent application Ser. No. 60/678,574, filed May 5, 2005, the entire disclosure of which is incorporated herein by reference.

FIELD OF INVENTION

The present invention relates generally to magnetic resonance imaging ("MRI"), and more particularly, to a mode-scanning excitation MRI method and system.

BACKGROUND INFORMATION

In the field of magnetic resonance imaging ("MRI") it can be desirable to achieve a high signal-to-noise ratio ("SNR"). One technique for obtaining a higher SNR is to increase the magnetic field strength. As magnetic fields increase in strength, various problems may arise, some of which can compromise the advantages of higher-field MRI. One of these problems is dielectric resonance, which can occur when a resonance wavelength is comparable to a dimension of the human body.

Wave effects of electromagnetic fields ("EMF") can make it difficult to achieve global homogeneous excitation. This may cause images of some areas of the body to appear overly darkened and other areas to appear overly brightened. Presently, 3 T scanners are widely available in clinical settings around the world, but their coils are often affected by this problem, which can limit their use in various MRI applications. The dielectric resonance problem can be even more pronounced at higher magnetic fields (e.g., fields greater than 7.0 T). This problem is described, e.g., in Vaughn, J T, et al., *Magnetic Resonance Med.*, 2001, 46:24.

Existing MRI methods may not adequately overcome the dielectric resonance problems. One conventional method of addressing dielectric resonance is to add an extra dielectric band around the body of a patient. However, this approach generally may not be well-controlled and must be applied on a case-by-case basis.

Thus there exists a need to provide an improved magnetic resonance imaging method and system which overcomes at least some of the above-referenced deficiencies.

SUMMARY OF EXEMPLARY EMBODIMENTS OF THE PRESENT INVENTION

Accordingly, an improved magnetic resonance imaging method and system is provided by exemplary embodiments of the method and system according to the present invention. One exemplary embodiment is directed to a method of generating a specified transmit magnetic field profile (a specified "excitation profile"), in the presence of an object for a magnetic resonance image. A plurality of modes can be excited in the presence of an object using a volume strip array ("VSA") having a plurality of conductive elements. These elements can be resonators, and may further be radio frequency ("RF") resonators. Such a system is described, e.g., in U.S. Patent Application No. 60/658,139. A further transmit magnetic field profile may then be acquired for each of the modes. Weighting factors for these modes can then be determined based on the specified profile and the further profiles. The weighting factors may be calculated using a least-squares analysis or a non-linear decomposition procedure. The specified profile can then be generated by applying signals to ports associated with the conductive elements of the array. The amplitude and phase of each signal can be determined based on the weighting factors. A Fourier transformation of the weighting factors associated with the modes can be used to calculate the amplitude and phase of each signal associated with each conductive element.

In another exemplary embodiment of the present invention, an apparatus is provided having a plurality of conductive elements arranged essentially parallel to each other in an essentially cylindrical configuration. Each of the elements can carry a current provided by a signal based on a specified transmit magnetic field profile. The apparatus can further include a computer or other processing arrangement. The specified profile may be generated by applying the signals to ports associated with the conductive elements, where the signals may be determined using the processing arrangement based on further excitation profiles corresponding to modes associated with the conductive elements and the specified profile.

In yet another exemplary embodiment of the present invention, a computer-readable medium is provided having stored thereon computer-executable instructions for performing a procedure of generating a particular transmit magnetic field profile in the presence of an object. The procedure can include obtaining data based on exciting a plurality of modes in the presence of an object using a volume strip array having a plurality of conductive elements. A further excitation profile can be acquired for each of the modes, and weighting factors can be determined relating these further profiles to the particular profile. The weighting factors can be used to determine a phase and an amplitude of a signal corresponding to each conductive element, and the particular profile can be generated by applying these signals to ports associated with the corresponding elements.

In a further exemplary embodiment of the present invention, further excitation profiles ("EPs") of a set of modes are established that include at least two modes associated with an array of conductive elements. Further, an approximately-equal relation between a specified excitation profile ("SEP") and a linear combination of the EPs can be established. Coefficients of the linear combination can be derivable using minimum least square procedures and/or singular decomposition value procedures. The SEP can be generated by applying a set of weighting factors on the ports of transmit array coils. In addition, the weighting factors may be derivable from a Fourier transform of the set of coefficients of the combination.

According to another exemplary embodiment of the present invention, a method, system and storage medium are provided which are capable of generating a specified excitation profile in the presence of an imaging object. In particular, data associated with modes corresponding to an array of conductive elements can be obtained. Then, the specified excitation profile may be determined based on the data.

These and other objects, features and advantages of the present invention will become apparent upon reading the following detailed description of embodiments of the invention, when taken in conjunction with the appended claims.

BRIEF DESCRIPTION OF THE DRAWINGS

Further objects, features and advantages of the invention will become apparent from the following detailed description taken in conjunction with the accompanying figures showing illustrative embodiments of the invention, in which.

DETAILED DESCRIPTION OF EXEMPLARY EMBODIMENTS OF THE INVENTION

Figure 1:
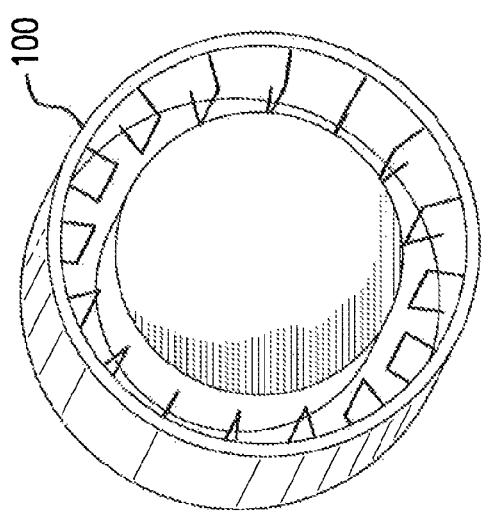
FIG. 1 is an illustration of an exemplary volume strip array in accordance with certain embodiments of the present invention.

A mode-scanning excitation ("MSE") procedure can be provided to achieve a locally homogenous transmit magnetic field profile (or "B1$^+$ profile") in desired locations and patterns at a high magnetic field (e.g., 7 T or higher). Base functions may be established initially by manipulating port voltage distributions in a multi-port transmit stage to generate a set of B1$^+$ profiles, or maps, of all basic modes of a volume array in presence of an imaging object. Next, a singular value decomposition ("SVD") can be applied to the base function matrix in order to estimate a mode distribution of the desired B1$^+$ map. Then, a port voltage distribution for the desired B1$^+$ map may be derived from the Discrete Fourier Transform of the mode distribution. This MSE can be verified in Finite Difference Time Domain (FDTD) simulations.

To circumvent dielectric resonance in a 7 T MRI procedure, a locally homogeneous solution can be provided. Local excitation was obtained by controlling the spatial location and spatial pattern of the image. The MSE method takes advantage of a multiple-port transmit stage of a volume strip array ("VSA") having a plurality of parallel conductive elements arranged essentially parallel to each other to form a cylindrical arrangement. Such an arrangement is described, e.g., in Lee R. F., et al., Proc. 12$^{th}$ ISMRM, p. 34, Japan; and in Lee R. F. et al., Proc. 11$^{th}$ ISMRM, p. 467, Canada.

In one exemplary embodiment of the present invention, the VSA generates a complete set of all mode B1$^+$ maps in the presence of an imaging object. All possible orthogonal modes can be excited and B1$^+$ maps may be acquired, where the maps can be represented by $b_k(x,y)$, where k is a mode index that ranges from 0 to n−1, and where n is the total number of elements of the VSA. The value of n also represents the maximum number of modes corresponding to a particular VSA.

The set of maps may be used to set base functions to estimate the mode distribution of a selected B1$^+$ map of a local excitation using an SVD. In one exemplary embodiment of the present invention a desired B1$^+$ map can be selected, which may be either a homogeneous or a spatially selective map, P(x,y). P(x,y) is composed of a linear combination of all of the orthogonal mode B1$^+$ mappings $b_k(x,y)$, which may be expressed as $$P(x, y) = \sum_{k=0}^{n-1} a_k b_k(x, y) \quad (1)$$

This equation can be used to resolve $a_k$, where $$a_k = \sum_x \sum_y P(x, y) b_k(x, y) \quad (2)$$

In this equation, $a_k$ represents a mode coefficients for generating the specified B1$^+$ map P(x,y). Port coefficients $c_i$, which are the coefficients of each port of each conductive strip, may be defined such that during a transmit stage, a power source at each port i can be weighted by $c_i$ to achieve a specified B1$^+$ excitation map P(x,y). The values of $a_k$ and $c_i$ are related by a Discrete Fourier Transform ("DFT"), such that $\{c_i\}$=DFT$\{a_k\}$, where the value of i ranges from 0 to n−1. If $c_i$ is known and used as a weighting factor on each port of the VSA during a transmit stage, a desired excitation profile may be achieved and inhomogeneity caused by dielectric resonance may be overcome in high field MRI procedures. Because the MSE method can acquire base B1$^+$ functions for each imaging object, it can be a useful tool for in vivo imaging of heterogeneous objects.

In contrast to a receive stage, all n basic mode excitations of an n-element VSA can be generated during a transmit stage by controlling the amplitudes and phases of port voltages, regardless of the degree of degeneracy of the VSA. Both decoupled VSAs and coupled VSAs may be capable of exciting all basic modes, although their power requirements may be different. This is indicated by the following relationship: $I^m(k)=(\Psi+Z^g)^{-1}V^m(k)=(\Psi+Z^g)^{-1}FV^g(p)$, where $I^m(k)$ and $V^m(k)$ are mode-current and mode-voltage vectors, respectively, and $V^g(p)$ is a port-voltage vector. The impedance matrix $Z=F^H\Psi F$, where F is the DFT matrix because Z is the circulant matrix, and $Z^p$ is an impedance matrix of power sources.

A desired excitation location and a pattern in the u×u matrix may be specified. This matrix may be converted to a (uu)×1 vector b. Different port-voltage vectors can be varied n times to generate a total of n u×u basic mode B1$^+$ matrices. The B1$^+$ matrices may then be converted to a (uu)×n matrix A. A linear combination of the basic mode maps can be used to estimate the desired excitation profile in the minimum least square error, min‖Ax−b‖$_2$. Thus if A is decomposed by a SVD, e.g., A=USV$^T$, then the coefficients of the mode distribution can be calculated as x=VS$^{-1}$U$^T$b. The port voltage distribution y for generating desired local excitation can be calculated from y=FFT{x}.

The MSE method described herein was verified in one exemplary embodiment of the present invention using EMF simulation software XFDTD (REMCOM, State College, Pa.). FIG. 1 shows a 16-channel VSA and a cylindrical sample. The diameter and length of the shield are 30.4 cm and 38 cm, respectively. The conductive elements are copper strips, each 30 cm long and 1.2 cm wide, and the strip-to-shield distance is 2.0 cm. The diameter and length of the sample are 22 and 26 cm, respectively, the $\epsilon_r$ value is 65, and σ=0.3 mho. The VSA was tuned to 300 MHz. Each transmit stage B1$^+$ field was calculated from two sets of Bx and By values which were obtained a quarter period apart in time. Although the sample used in this exemplary embodiment was homogeneous, the MSE method and system may also be used with heterogeneous samples.

Figure 2:
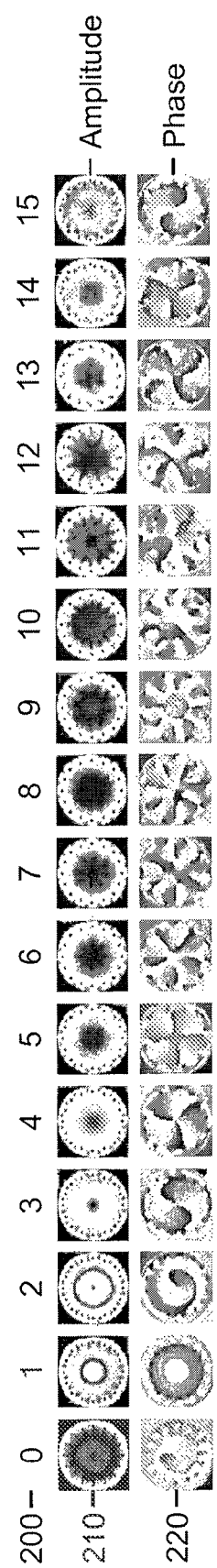
FIG. 2 is an exemplary illustration of basic mode maps in accordance with an exemplary embodiment of the present invention.

FIG. 2 shows 16 basic mode B1$^+$ maps of the 16-channel VSA, labeled 0 through 15 in row 200, which can be used as base functions for SVD estimation. The diagrams in row 210 show the amplitude for each mode, and the diagrams in row 220 show the corresponding phase for each mode.

Figure 3:
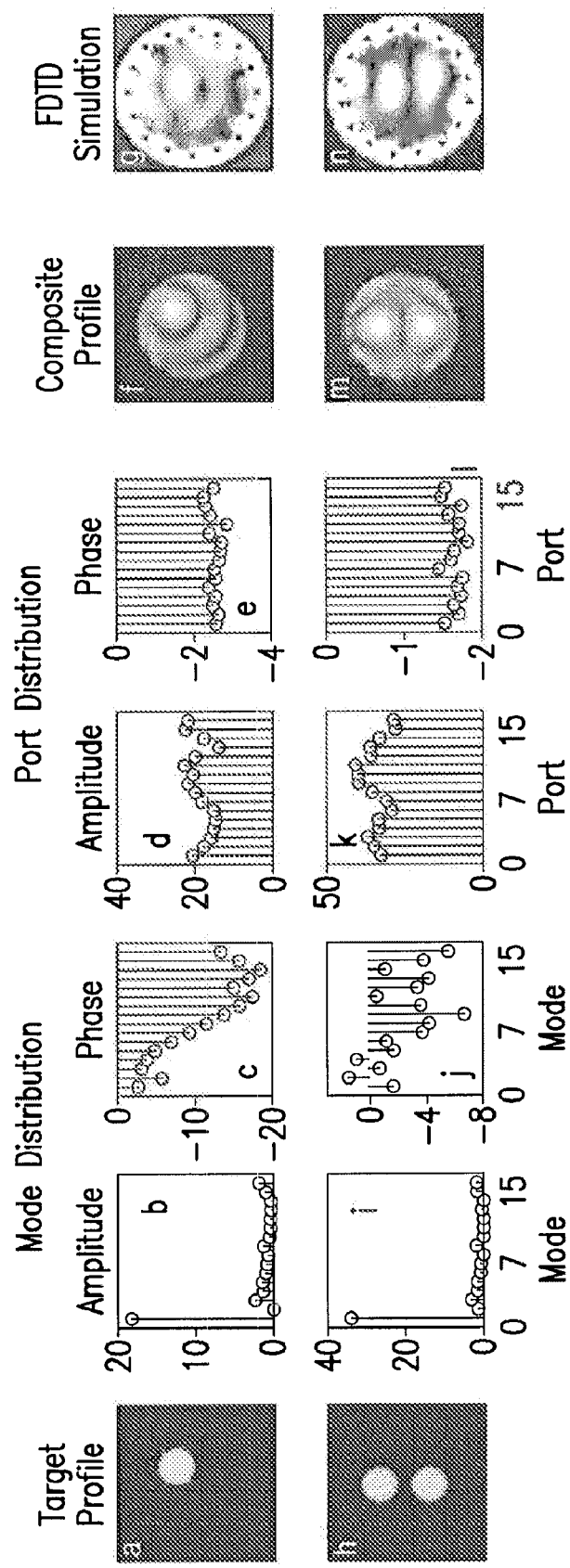
FIGS. 3a-3n are exemplary visual outputs of steps implementing an exemplary embodiment of the process system and storage medium in accordance with the present invention.

A two-dimensional 16$^{th}$ order Butterworth filter with a linear phase is used as the desired excitation regions in FIGS. 3a and 3h. For a desired excitation region located in the upper right corner of a sample, as shown in FIG. 3a, the SVD indicates that the mode distribution should appear as shown in FIGS. 3B-C. The FFT of the mode distribution corresponds to the voltage port distribution, which is shown in FIGS. 3d-e. The composite excitation profile from base functions is shown in FIG. 3f. Combining the port distribution into the FDTD model results in the B1$^+$ map shown in FIG. 3g.

Similar results based on two region excitations are shown in FIGS. 3h-n. Two region excitations are shown in FIG. 3h. The corresponding SVD indicates that the mode distribution should appear as shown in FIGS. 3i-j. The FFT of the mode distribution corresponds to the voltage port distribution, which is shown in FIGS. 3k-l. The composite excitation profile from base functions is shown in FIG. 3m. Combining the port distribution into the FDTD model results in the B1$^+$ map shown in FIG. 3n.

As described herein, an MSE method and system are presented that are capable of generating locally homogeneous excitations in desired locations and patterns at higher magnetic field strengths such as, e.g., 7 T. The object-oriented base functions associated with this method and system enable it to be used with any in vivo heterogeneous sample.

Figure 4:
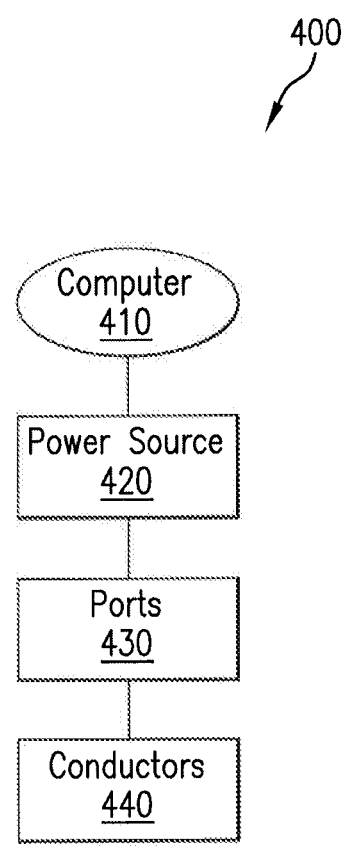
FIG. 4 is a schematic diagram of an exemplary system according to an exemplary embodiment of the present invention.

An exemplary embodiment of a system 400 for implementing the present invention is shown in FIG. 4. For example, a plurality of conductors 440 may be provided, where the conductors are capable of facilitating current flows and generating associated magnetic fields related to the current flows. The conductors can be arranged, for example, in the form of a VSA. A plurality of ports 430 can be provided, where a port may be associated with each of the conductors 440. A power source 420 can also be connected to the ports 430. The power source 420 can be configured to provide one or more specific port voltage distributions to the ports 430, which in turn may excite currents in the conductors 440. A computer 410 may be configured, e.g., to determine weighting factors for individual modes as described herein to generate desired excitation profiles. The computer 410 can be in communication with the power source 420, and can be configured to control the port voltage distributions applied to the ports 430. The computer 410 can include a hard drive, CD ROM, RAM, and/or other storage devices or media which can include thereon software, which can be configured to execute the exemplary embodiments of the method of the present invention.

Figure 5:
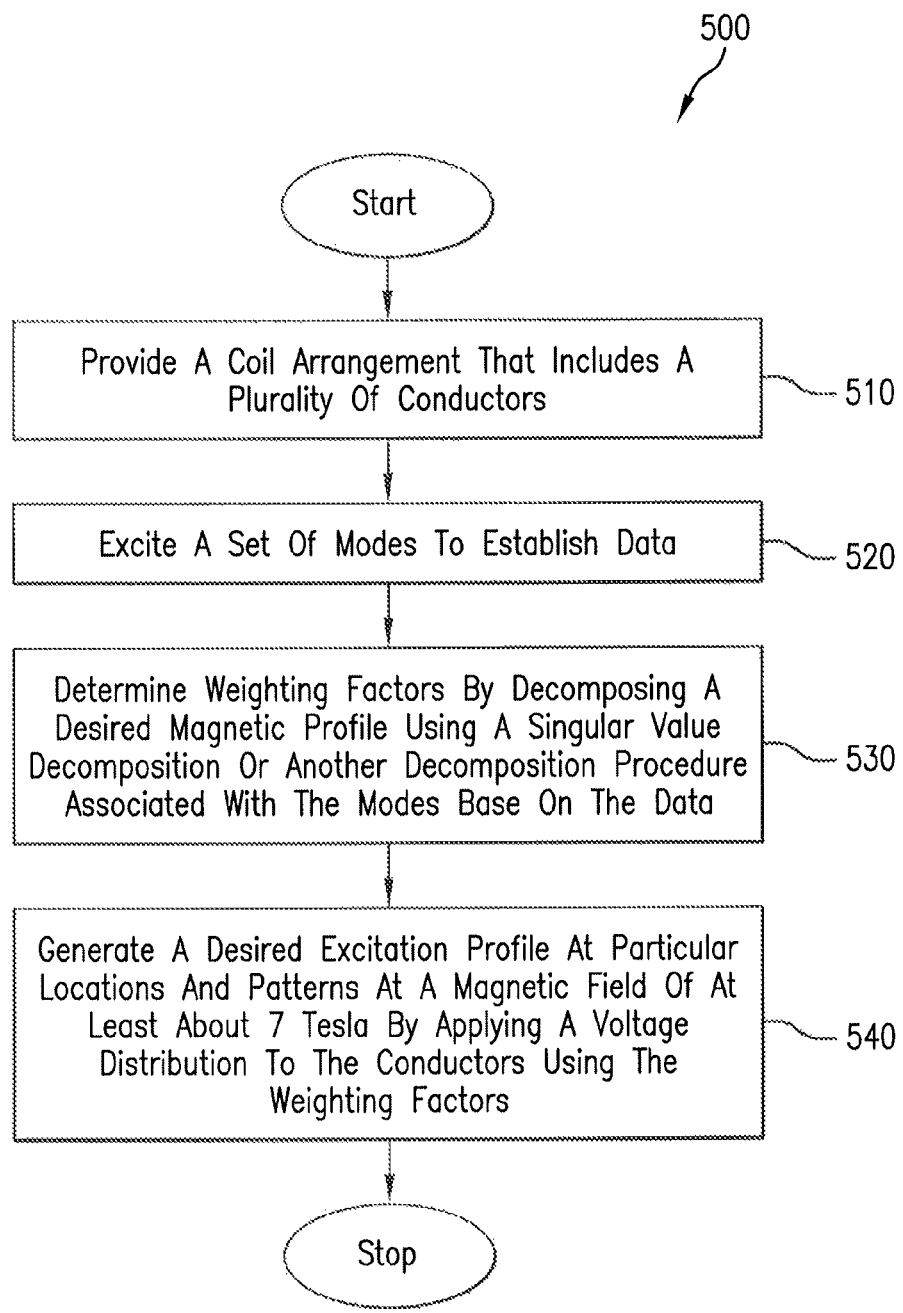
FIG. 5 is a flow diagram of an exemplary embodiment of a method according to the present invention.

An exemplary flow diagram of a method 500 according to exemplary embodiments of the present invention is shown in FIG. 5. A coil arrangement may be provided that includes a plurality of conductors (step 510). The coil arrangement may be configured as a VSA. Each conductor may have one or more ports associated with it that are configured to provide an input voltage. A set of modes can be excited in the coil arrangement (step 520) to generate data associated with the individual modes. This data can include information describing characteristics associated with a magnetic field corresponding to a mode. The modes can be excited, e.g., by applying voltages to one or more of the conductors. Based on the data, a set of weighting factors for the modes may be determined (step 530). A desired excitation pattern may then be generated using the weighting factors (step 540). The weighting factors can represent, e.g., linear coefficients associated with the individual modes. The excitation profile may be generated, for example, by applying voltages to the conductors that are related to the weighting factors, which may be based on the data established for the individual modes (step 520).

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the present invention and are thus within the spirit and scope of the present invention. It is desired that the embodiments described herein be considered in all respects illustrative and not restrictive and that reference be made to the appended claims and their equivalents for determining the scope of the invention. In addition, all publications, patents and/or patent applications referenced above are incorporated herein by reference in their entireties.

What is claimed is:

1. A mode-scanning excitation method, usable with a magnetic resonance, for generating a particular transmit magnetic field profile in the presence of an object to be scanned, comprising:
   using a computer processing arrangement:
   a) obtaining data for a plurality of modes associated with an array of conductive elements during a transmission of radiation in the presence of the object;
   b) determining a plurality of constant weighting factors by decomposing a desired magnetic profile into the data for the plurality of modes using a singular value decomposition or another decomposition procedure; and
   c) generating the particular transmit magnetic field profile at particular locations and patterns at a magnetic field of at least about 7 Tesla by applying a plurality of signals to the array, wherein the signals are based on the constant weighting factors.

2. The method of claim 1, wherein the conductive elements are resonator elements.

3. The method of claim 1, wherein step (a) comprises exciting the modes to transmit at least one magnetic field in proximity to at least a portion of the object.

4. The method of claim 1, wherein step (a) comprises transmitting a magnetic field associated with each of the modes.

5. The method of claim 1, wherein step (a) comprises establishing a further transmit magnetic field profile associated with each of the modes.

6. The method of claim 5, wherein the weighting factors are further determined using a linear combination of the mode profiles for approximating the further profiles.

7. The method of claim 1, wherein step (a) comprises transmitting a magnetic field using at least one of the elements, wherein the magnetic field is characterized by a constant magnitude and a plurality of harmonic orders.

8. The method of claim 1, wherein the data is obtained by exciting a particular number of the modes that is less than or equal to a number of the elements provided in the array.

9. The method of claim 1, wherein the data is obtained by controlling at least one of an amplitude or a phase of a voltage that is applied to each of the elements provided in the array.

10. The method of claim 1, wherein the data comprises a further transmit magnetic field profile associated with each of the modes in the presence of the object.

11. The method of claim 1, wherein step (b) comprises applying a particular procedure that is at least one of:
   a least-square error procedure, or
   a non-linear decomposition procedure, to a linear combination of the mode profiles for generating further profiles.

12. The method of claim 1, wherein step (c) comprises establishing a phase and a magnitude associated with each of the signals.

13. The method of claim 12, wherein the phase and the magnitude are determined by applying a Fourier transformation to the weighting factors.

14. The method of claim 13, wherein each signal is associated with a particular conductive element in the array.

15. The method of claim 14, wherein step (c) comprises applying each signal to a port associated with the particular conductive elements.

16. The method of claim 1, wherein each of the weighting factors is a mode distribution coefficient.

17. The method of claim 1, wherein the weighting factors are used to control a current in each of elements at a predetermined time.

18. The method of claim 1, wherein the object is an anatomical object.

19. A mode-scanning excitation apparatus, usable with a magnetic resonance comprising:
an array of conductive elements;
a plurality of ports, wherein at least one of the ports is associated with a respective one of the conductive elements, and wherein each of the conductive elements is capable of facilitating a current flow to generate a particular magnetic field at particular locations and patterns of at least about 7 Tesla in the presence of an object in response to signals applied to the ports, and wherein the signals are capable of being determined using constant weighting factors; and
a processing arrangement configured to determine the constant weighting factors by decomposing a desired magnetic field profile into data for a plurality of modes using a singular value decomposition or another decomposition procedure and using a linear combination of transmit magnetic field profiles corresponding to a plurality of modes associated with the conductive elements.

20. The apparatus of claim 19, wherein the elements are arranged essentially parallel to one another in a cylindrical configuration.

21. The apparatus of claim 20, wherein a number of available modes is based on a number of the elements.

22. A non-transitory computer-readable medium having stored thereon computer-executable instructions for performing a mode-scanning excitation procedure, usable with a magnetic resonance, in order to generate a particular transmit magnetic field profile in the presence of an object, wherein the procedure comprises:
obtaining data for a plurality of modes associated with an array of conductive elements during a transmission of radiation in the presence of the object;
determining a plurality of constant weighting factors by decomposing a desired magnetic profile into the data for the plurality of modes using a singular value decomposition or another decomposition procedure; and
generating the particular transmit magnetic field profile at particular locations and patterns at a magnetic field of at least about 7 Tesla by applying a plurality of signals to the array, wherein the signals are based on the constant weighting factors.

23. The non-transitory computer-readable medium of claim 22, wherein the procedure further comprising: transmitting a magnetic field associated with each of the modes.

24. The non-transitory computer-readable medium of claim 22, wherein the procedure is performed to obtain the data by exciting a particular number of the modes that is less than or equal to a number of the elements provided in the array.

25. The non-transitory computer-readable medium of claim 22, wherein the procedure is performed to obtain the data by controlling at least one of an amplitude or a phase of a voltage that is applied to each of the elements provided in the array.

26. The non-transitory computer-readable medium of claim 22, wherein the procedure further comprising establishing a phase and a magnitude associated with each of the signals, wherein each signal is associated with a particular conductive element in the array.

27. The non-transitory computer-readable medium of claim 26, wherein the procedure applies the signals by applying each of the signals to a port associated with the particular conductive elements.

28. The non-transitory computer-readable medium of claim 22, wherein each of the weighting factors is a mode distribution coefficient.

29. A mode-scanning excitation method, usable with a magnetic resonance, for generating a particular transmit magnetic field profile in the presence of an object using an array of conductive elements, comprising:
using a computer processing arrangement:
obtaining further transmit magnetic field profiles based on modes associated with the elements during a transmission of radiation in the presence of the object;
establishing a relationship between the particular transmit magnetic field profile and a linear combination of the further profiles, wherein coefficients of the linear combination are derivable using at least one of a minimum least-squares procedure or a singular decomposition value procedure; and
generating the particular profile at particular locations and patterns at a magnetic field of at least about 7 Tesla by applying signals to a plurality of ports associated with the array of elements, wherein the signals are based on constant weighting factors.

30. The method according to claim 29, wherein each signal comprises a magnitude and a phase.

31. The method according to claim 30, wherein the magnitude and the phase associated with each signal are based on a Fourier transform of the weighting factors.

32. A mode-scanning excitation method, usable with a magnetic resonance for generating a particular transmit magnetic field profile in the presence of an object, comprising:
using a computer processing arrangement:
obtaining data associated with signals provided at ports of an array of conductive elements in the presence of the object; and
generating the particular profile at particular locations and patterns at a magnetic field of at least about 7 Tesla by providing signals to the elements based on the data;
wherein the signals are based on constant weighting factors determined by decomposing a desired magnetic profile into the data using a singular value decomposition or another decomposition procedure.

33. A non-transitory computer-readable medium having stored thereon computer-executable instructions for performing a mode-scanning excitation procedure, usable with a magnetic resonance, to generate a particular transmit magnetic field profile in the presence of an object, the procedure comprising:

obtaining data associated with signals provided at ports of an array of conductive elements in the presence of the object; and generating the particular profile at particular locations and patterns at a magnetic field of at least about 7 Tesla by providing signals to the elements based on the data;

wherein the signals are based on constant weighting factors determined by decomposing a desired magnetic profile into the data using a singular value decomposition or another decomposition procedure.

* * * * *